United States Patent [19]

Eda et al.

[11] Patent Number: 5,448,126
[45] Date of Patent: Sep. 5, 1995

[54] SURFACE ACOUSTIC WAVE-SEMICONDUCTOR COMPOSITE DEVICE

[75] Inventors: Kazuo Eda, Nara; Yutaka Taguchi, Ibaraki, both of Japan

[73] Assignee: Matsushita Electric Industrial Co., Ltd., Osaka, Japan

[21] Appl. No.: 322,307

[22] Filed: Oct. 4, 1994

[30] Foreign Application Priority Data

Oct. 5, 1993 [JP] Japan .................. 5-249016
Oct. 5, 1993 [JP] Japan .................. 5-249017

[51] Int. Cl.$^6$ .......................... H01L 41/08
[52] U.S. Cl. ..................... 310/313 A; 310/313 R; 310/344; 364/821
[58] Field of Search ............ 310/313 A, 313 R, 344; 333/193, 150, 154, 155; 364/819-821

[56] References Cited

U.S. PATENT DOCUMENTS

| | | | |
|---|---|---|---|
| 3,914,836 | 10/1975 | Hafner et al. | 29/25.35 |
| 3,952,268 | 4/1976 | Schulz et al. | 333/193 |
| 4,270,105 | 5/1981 | Parker et al. | 310/313 A |
| 5,319,324 | 6/1994 | Satoh et al. | 331/158 |

FOREIGN PATENT DOCUMENTS 63-19711  8/1988  Japan .

OTHER PUBLICATIONS

Khuri-Yakub et al., "A monolithic zinc–oxide–on–silicon convolver", *Applied Physics Letters*, vol. 25, No. 4, Aug. 15, 1974, pp. 188–190.
Kino et al., "Convolution and parametric interaction with semiconductors", *J. Appl. Phys.*, vol. 44, No. 12, Dec. 1973, pp. 5219–5221.
Bers et al., "Surface state memory in surface acoustoelectric correlator", *Applied Physics Letters*, vol. 25, No. 3, Aug. 1974, pp. 133–135.
Yamanouchi et al., "Propagation and Amplification of Rayleigh Waves and Piezoelectric Leaky Surface Waves in LiNbO$_3$", *J. Appl. Phys.*, vol. 43, No. 3, Mar. 1972, pp. 856–862.

Primary Examiner—Mark O. Budd
Attorney, Agent, or Firm—Wenderoth, Lind & Ponack

[57] ABSTRACT

In a surface acoustic wave-semiconductor composite device such as a surface acoustic wave convolver, a piezoelectric plate and a semiconductor plate are layered directly or with a gap between them. Input electrodes are provided to apply a plurality of input signals to the piezoelectric plate to excite surface acoustic waves, while an output electrode is provided to detect a convolution output signal of a change in electric potential of the semiconductor plate at an interface of the semiconductor plate with the piezoelectric plate. In the layered structure, the semiconductor plate is bonded directly to the piezoelectric plate by hydrogen bonds between hydroxyl groups or by covalent or ionic bonds of oxygen atoms with component atoms of the piezoelectric and semiconductor plates. In modified structures, an inorganic thin film is applied to one of the piezoelectric and semiconductor plates, while the inorganic thin film is bonded directly to the other of the two plates. The surface acoustic wave-semiconductor composite device can be prepared by using direct bonding in an atomic order, with a thickness of a direct bonding layer of 20 nm or less. Then, it has a low insersion loss and a high efficiency, and it is stable thermally and mechanically. Further, its characteristics can be reproduced well.

41 Claims, 10 Drawing Sheets

SURFACE ACOUSTIC WAVE-SEMICONDUCTOR COMPOSITE DEVICE

BACKGROUND OF THE INVENTION

1. Field of the Invention

The present invention relates to a surface acoustic wave-semiconductor composite device using an interaction between surface acoustic waves and surface charges in a semiconductor, in particular, to a surface acoustic wave convolver.

2. Description of the Prior Art

Recently, electric waves for communication are used widely according to the development of mobile communication technology. Then, shortage of channels, cross talk, eavesdropping and the like become large problems. In order to solve these problems, various new communication methods are proposed. Code division multiple access (CDMA) method is one of potential communication methods which have been studied and developed because it can increase a channel number by a factor of one digit or more in a same frequency band. The CDMA method uses a spread-spectrum communication technology, wherein a receive terminal usually includes a convolver for a convolution operation of input signals with standard signals in order to demodulate signals.

Surface acoustic wave convolvers are known which combines a surface acoustic wave device and a semiconductor element, and they are classified into a monolithic type, wherein a semiconductor substrate and a piezoelectric plate are layered integrally as a one body, and a separation medium structure type, wherein a gap is provided between a piezoelectric plate and a semiconductor plate opposing each other. A surface acoustic wave convolver of monolithic type is described, for example, in a paper by B. T. Khuri-Yakub et al. (Applied Physics Letters, Vol. 25, 188-190 (1974)), while a surface acoustic wave convolver of separation medium type is described in a paper by G. S. Kino et al. (Journal of Applied Physics, Vol. 44, 5219-5221 (1973)).

FIG. 1 shows a representative metal-insulator-semiconductor (MIS) structure of a surface acoustic wave convolver of monolithic type. A semiconductor plate 21 made of silicon or the like and a piezoelectric plate 22 made of ZnO, AlN or the like are layered with an insulator layer 26 provided at an interface between them. The insulator layer 26 is made of $SiO_2$ prepared for example with sputtering, and the piezoelectric plate 22 is also prepared with sputtering. Signal input electrodes 23, 23' of interdigital transducer (IDT) and an output electrode 24 are provided on the piezoelectric plate 22, while a ground electrode 25 is provided on the semiconductor plate 21.

Next, an operation of the surface acoustic wave convolver is explained. Signals are supplied to the two signal input electrodes 23, 23' of interdigital transducer and surface acoustic waves propagates along the interface and interact with each other below the output electrode 24. The surface acoustic waves cause displacement of charges of the semiconductor plate 21 along the interface, so that they change a capacitance of a depletion region in the semiconductor plate 21. Convolution signals are taken out from the output electrode 24 by using nonlinearity of voltage dependence of the capacitance of the depletion layer.

The surface acoustic wave convolver of monolithic type has a high sensitivity and good characteristics. It is also known that the characteristics can be improved by forming a semiconductor layer of low concentration or a semiconductor layer of various kinds of structures with epitaxial crystal growth (for example, Japanese Patent laid open Publication 63-197111/1988).

In the prior art surface acoustic wave convolver, materials which can be used as a piezoelectric thin film is limited. It is required that a material of good piezoelectric properties is formed on a semiconductor substrate of silicon or the like or on an insulator layer of $SiO_2$ or the like formed on the semiconductor substrate with a thin film technique such as sputtering, chemical vapor deposition, vacuum deposition, molecular beam epitaxial growth or the like. Such a material is substantially limited to ZnO and AlN. Lithium niobate and lithium tantalate having a large electromechanical coupling factor and large nonlinearity, and quartz and lithium borate having very small temperature dependence cannot be used for the piezoelectric plate 22. Though a thin film of lithium niobate is tried to grow with sputtering, a resultant thin film has characteristics much worse than a single crystal of lithium niobate. Generally, properties such as piezoelectric property which are closely related to the crystallinity of a material are better for a single crystal than for a layer prepared with a thin film technique. This situation is similar to other materials such as lithium tantalate, lithium borate and quartz.

Properties propagated by surface acoustic waves are very sensitive to the density, crystallinity and the like of the piezoelectric material. Therefore, a productivity is also a problem because it is difficult to reproduce the density, crystallinity and the like with a good yield.

A reverse structure is also known where a semiconductor thin film of InSb or the like is formed on a single crystal plate of piezoelectric material with vacuum deposition or the like. However, this structure deteriorates semiconductor characteristics largely. Because the monolithic convolver uses a change in a capacitance of the depletion region at the interface of the semiconductor substrate, it is necessary to keep the electronic states at the interface good. However, a semiconductor thin film formed on a substrate of a different material with a thin film technique such as vacuum deposition, sputtering, chemical vapor deposition or the like becomes a polycrystal or an amorphous crystal. Therefore, an obtained film has very many surface levels, or the electronic states at the interface cannot be controlled well sufficiently. Therefore, this structure also cannot produce a convolver of good characteristics. On the other hand, it is not desirable practically to prepare a thick piezoelectric plate as an insulator because an operation voltage becomes higher if compared with a convolver with a thick semiconductor having a low resistance.

On the other hand, if an adhesive such as an organic material or glass is used to combine a semiconductor plate and a piezoelectric plate to form a convolver, it has several disadvantages. First, because the thickness of the adhesive layer is usually of an order of micrometers or 1-5 micrometers, a voltage change due to surface acoustic waves cannot be transmitted to the semiconductor plate efficiently. Further, because the thickness cannot be controlled precisely, convolution signals are deteriorated due to the nonuniform thickness. Further, because the thickness of the adhesive layer varies in each production process, the reproducibility of the convolver cannot become good. Second, the adhesive agent itself is not stable thermally and chemically.

Therefore, the temperature dependence of the characteristics is a problem. Thermal stability for a long time and reliableness on mechanical stability are not sufficient. Further, an application of an adhesive agent on the semiconductor surface generates unnecessary surface levels, and this deteriorates properties of a convolver.

FIG. 2 shows a representative structure of a separation medium structure surface acoustic wave convolver. A piezoelectric plate 22' having large nonlinearity, made of for example lithium niobate single crystal, and a semiconductor plate 21 made of silicon are separated by a narrow gap 27 with spacers 28, made of silicon oxide films, placed at positions which do not affect the propagation of surface acoustic waves as much as possible. Adhesive agents 28 are also provided to adhere the semiconductor plate 21' and the piezoelectric plate 22' at positions which do not affect the propagation of surface acoustic waves as much as possible. A ground electrode 25 is provided on a surface of the piezoelectric plate 22', while signal input electrodes 23, 23' or interdigital transducer (IDT) are provided on the other opposite surface of the piezoelectric plate 22'. An output electrode 24 is provided on the semiconductor plate 21. Posts of about 5 $\mu$m of diameter and height of 100 nm prepared with etching may also be used instead of the spacer 28 in order to keep the gap 27 to have a constant distance between the piezoelectric plate 22' and the semiconductor plate 21.

Next, an operation of the convolver is explained. Signals are supplied to the two signal input electrodes 23, 23' or interdigital transducers and surface acoustic waves propagate along the surface of the piezoelectric plate 22' and interact with each other below the output electrode 24. The surface acoustic waves cause displacement of charges of the semiconductor plate 21 along the surface. This displacement generates a change in potential at the surface of the semiconductor plate 21. Convolution signals are taken out from the output electrode 24 by using nonlinearity of the interaction.

A separation medium structure surface acoustic wave convolver has a high sensitivity and good characteristics because nonlinearity of a lithium niobate single crystal having large nonlinearity and a semiconductor surface is used.

In a separation medium structure surface acoustic wave convolver described above, the sensitivity depends on the distance of the gap 27 very much. Therefore, fixing of the spacers 28 or the like is an important problem to keep the gap to have a constant distance. That is, in the structures using the spacers, the etching posts or the like, an adhesive agent is used for binding, or screws or threads are used for mechanical fixing. However, characteristics change easily due to thermal or mechanical stress. If an adhesive made of an organic material is used, the distance of the gap cannot be controlled precisely, and if gas is generated on heating, characteristics are effected by the adsorption of gas. If an adhesive made of an inorganic material such as solder or glass is used, the distance of the gap cannot be controlled precisely. Then, though a separation medium structure surface acoustic wave convolver has a high sensitivity, it is not used substantially practically.

Beside the above-mentioned convolvers, there are known, there are known similar devices. In such devices, a piezoelectric plate and a semiconductor plate are layered or opposed with each other with a very small gap between them, and surface acoustic waves are propagated on a surface of the piezoelectric plate opposing the semiconductor plate to interact with charges in the semiconductor plate to generate various effects. Such devices are called as surface acoustic wave-semiconductor composite device in the description. For example, a surface state memory in surface acoustoelectric correlator is described in a paper by A. Bers and J. H. Cafarella (Applied Physics Letters, Vol. 25, 133–135 (1974)), and a surface acoustic wave amplifier is described in a paper by K. Yamanouchi and K. Shibayama (J. Applied Physics, Vol. 43, 856–862 (1972)).

SUMMARY OF THE INVENTION

An object of the present invention is to provide a surface acoustic wave-semiconductor composite device, especially a surface acoustic wave convolver, having a low loss and a high efficiency.

A second object of the present invention is to provide a surface acoustic wave-semiconductor composite device, especially a surface acoustic wave convolver, having good thermal and mechanical stabilities.

A second object of the present invention is to provide a surface acoustic wave-semiconductor composite device, especially a surface acoustic wave convolver, which can be reproduced well in production thereof.

In a surface acoustic wave-semiconductor composite device such as a surface acoustic wave convolver, a piezoelectric plate is bonded directly to a semiconductor plate. Input and output electrodes for receiving and sending signals are provided at appropriate positions. In the device, the semiconductor plate is bonded directly to the piezoelectric plate by hydrogen bonds of hydroxyl groups or by covalent or ionic bonds of oxygen atoms with component atoms of the piezoelectric and semiconductor plates. The direct bonding is realized in an atomic order and stable and strong. The device using the direct bonding decreases an insertion loss. Preferably, the thickness of a direct bonding layer at an interface between the piezoelectric and semiconductor plates is 20 nm or less. Further, materials of good qualities can be used especially for the piezoelectric plate.

In a different structure of surface acoustic wave-semiconductor composite device, an inorganic thin film is provided between a piezoelectric plate and a semiconductor plate. The inorganic thin film is applied to one of the piezoelectric plate and the semiconductor plate and bonded directly to the other of the piezoelectric plate and the semiconductor. The inorganic thin film acts for example as a passivation film. If the inorganic thin film is made of an insulator, a metal-insulator-semiconductor structure is produced.

In a further structure of a surface acoustic wave-semiconductor composite device, a semiconductor plate is bonded directly to a piezoelectric plate, while the semiconductor plate has a gap except portions bonded directly to the piezoelectric plate. The surface acoustic wave-semiconductor composite device is prepared by using direct bonding in an atomic order, and preferably, the thickness of a direct bonding layer at an interface between the piezoelectric and semiconductor plates is 20 nm or less. Therefore, the gap can be controlled to have a very narrow constant distance relative to the piezoelectric plate. In a modified structure, an inorganic film is applied to one of the piezoelectric plate and the semiconductor plate and is bonded directly to the other of the piezoelectric plate and the semiconductor plate. The inorganic film has a gap except portions bonded directly to the piezoelectric plate.

An advantage of the present invention is that a surface acoustic wave-semiconductor composite device has a low insersion loss and a high efficiency.

Another advantage of the present invention is that a surface acoustic wave-semiconductor composite device which has reproducible characteristics can be provided.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
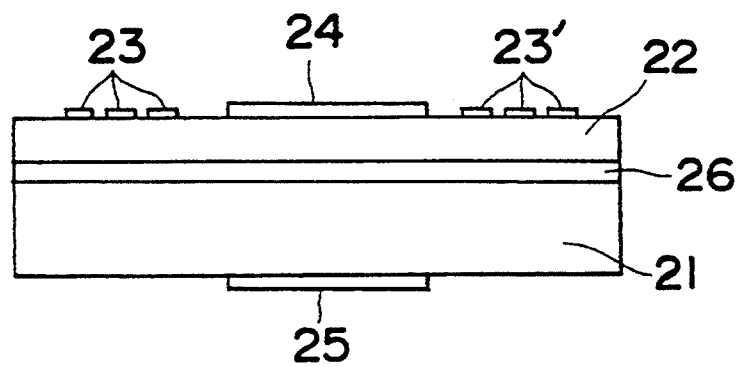
FIG. 1 is a schematic sectional view of a representative metal-insulator-semiconductor (MIS) structure of a prior art surface acoustic wave convolver of monolithic type.

Referring now to the drawings, wherein like reference characters designate like or corresponding parts throughout the views, embodiments of surface acoustic wave-semiconductor composite devices of the present invention will be explained below.

Embodiment 1

Figure 3:
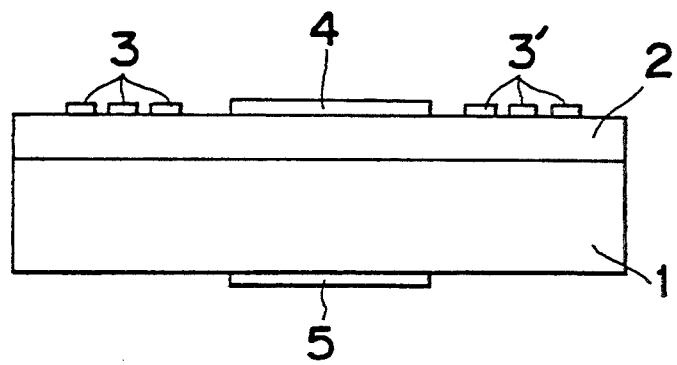
FIG. 3 is a schematic sectional view of a first basic structure of a surface acoustic wave-semiconductor composite device of the invention.

FIG. 3 shows a first basic structure of a surface acoustic wave-semiconductor composite device. The device shown in FIG. 3 is a monolithic surface acoustic wave convolver. A semiconductor plate 1 made of silicon or the like has a low carrier concentration region at a surface and a high carrier concentration region inside the plate 1. The semiconductor plate 1 is bonded directly with a piezoelectric plate 2 made of, for example, a single crystal of 41° Y-cut, X propagation of lithium niobate by hydrogen bonds due to hydroxyl groups or by covalent or ionic bonds due to oxygen atoms and component atoms of the two plates 1, 2. Interdigital transducers (IDT) 3, 3' as input electrodes for exciting surface acoustic waves are provided separately on the piezoelectric plate 2. In FIG. 3 and other drawings on a composite device, only three interdigital transducers 3, 3' are shown, but usually more electrodes than three are provided. An output electrode 4 is provided between the interdigital transducers 3, 3' on the piezoelectric plate 2, while an output electrode 4 is provided on the semiconductor plate at a rear position opposed to the ground electrode 5.

In the convolver shown in FIG. 3, two input signals are applied to the interdigital transducers 3, 3', respectively, and surface acoustic waves are excited to propagate along directions opposite to each other. The acoustic waves changes the potential at the interface of the semiconductor plate 1 with the piezoelectric plate 2, and this changes a capacitance of a depletion layer at the interface. Because of nonlinearity of this interaction, convolution signals of the input signals can be taken out between the output electrode 4 and the ground electrode 5.

This embodiment differs from the prior art convolver shown in FIG. 1 on a combination of materials of the semiconductor plate 1 and the piezoelectric plate 2 and a microscopic structure at the interface between the two plates produced by direct bonding. The bonding between the two plates 1, 2 is called as direct bonding since this is a special bonding of an atomic order without using a conventional adhesive agent such as an organic adhesive agent, as will be explained later. In the embodiment, the semiconductor plate 1 is made of silicon, while the piezoelectric plate 2 is made of, for example, a single crystal of lithium niobate having a specified crystal orientation. For example, lithium niobate of a single crystal of 41° Y-cut, X propagation has a very large electromechanical coupling factor (17.2%). On the other hand, the electromechanical coupling factor of a prior art ZnO thin film as the piezoelectric material deposited with sputtering is usually as low as about 2-3% though it varies with a material to be used and deposition conditions. With increasing electromechanical coupling factor, a conversion efficiency of input signals to surface acoustic waves increases and potential change at the interface of the semiconductor plate increases. Then, the high electromechanical coupling factor decreases an insertion loss at the interface largely and the converter can be used efficiently.

A manufacturing method of the surface acoustic wave-semiconductor composite device is explained below. First, a piezoelectric plate 2 of, for example, a single crystal of lithium niobate of a specific crystal orientation is prepared to have a specular surface. On the other hand, a semiconductor plate 1, for example, has a low carrier concentration region at a surface and a high carrier concentration region inside the plate and it also has a specular surface. The two surfaces are cleaned sufficiently, and an unnecessary layer at the surfaces are removed if necessary by etching by using an etchant of fluoric acid or the like.

Figure 4A:
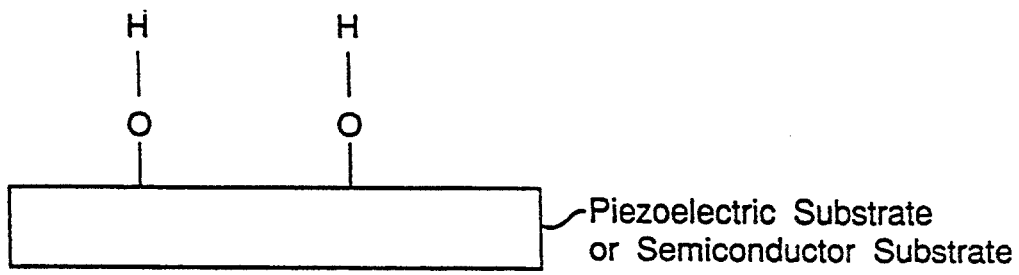
FIGS. 4A, 4B and 4C are schematic sectional views of direct bonding processes.
Figure 4B:
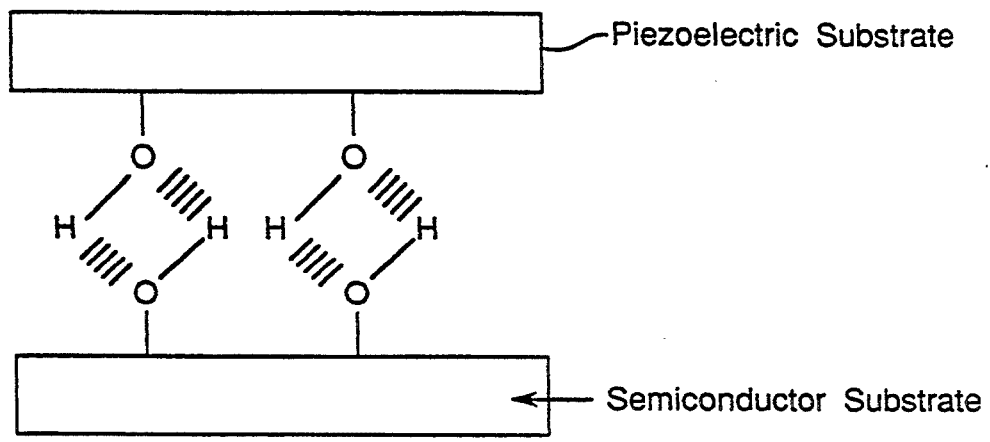

Then, the two surfaces 1, 2 are subjected to hydrophilic treatment. In concrete, after they are immersed in an ammonium-hydrogen peroxide mixture solution, they are rinsed with pure water sufficiently. Thus, hydroxyl groups are adhered to the surfaces of the two plates, as shown in FIG. 4A. A thickness of a layer made of the hydroxyl groups adhered to the surfaces is about one to a few molecules (a few nanometers). Next, the two surfaces are layered to contact with each other, and the two plates 1, 2 are combined with van der Waals' force to cause hydrogen bonds between hydroxyl groups, as shown in FIG. 4B. Thus, the two plates 1, 2 are bonded directly without using an conventional adhesive agent. A thickness of a bonding layer of the hydroxyl groups is less than 20 nm and usually less than 10 nm or less. This direct bonding is strong.

Figure 4C:
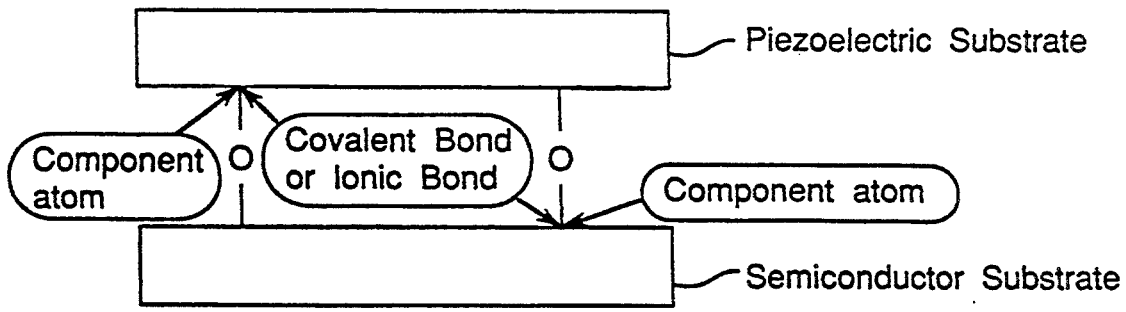

Heat treatment increases bonding strength further. That is, the two plates 1, 2 bonded directly is subjected to heat treatment for a few minutes to a few tens hours between 100° C. and a temperature at which each plate is damaged. The temperature is, for example, Curie temperature, or a temperature at which the distribution of carrier concentration of the semiconductor plate 1 do not change largely, and it is for example 1000° C. Then, the direct bonding becomes very stronger. This is ascribed to leaving of the hydrogen atoms from a bonding layer between the two plates 1, 2 and covalent bonds and ionic bonds result between oxygen atoms with silicon, lithium or niobium atoms, as shown in FIG. 4C. It seems that this change of chemical bonds proceeds especially at 200°–250° C. A thickness of the bonding layer is less than 20 nm and usually less than 10 nm or less.

The heat treatment is performed for example at 350° C. for one hour. Then, the direct bonding has an adhesion strength which makes it possible to polish the semiconductor plate or the piezoelectric plate in a manufacturing process of a surface acoustic wave-semiconductor composite device. The piezoelectric plate (or the lithium niobate single crystal plate) 2 is polished if necessary to a desirable thickness of say 10 μm. Before direct bonding, the thickness of the piezoelectric plate 2 is for example 350–50 μm for the easiness of handling. Finally, interdigital transducers 3, 3', an output electrode 4, a ground electrode 5 and the like are formed on the plates 1, 2 with a conventional photolithography, vacuum deposition or the like. Thus, a surface acoustic wave convolver shown in FIG. 3 is completed.

As explained above, the interface between the two plates 1, 2 is bonded directly in an atomic order, without using a conventional adhesive agent. Therefore, surface acoustic waves generated at the interface affect the distribution of spacial charges in the depletion layer at the interface very efficiently with a low insersion loss. Then, a surface acoustic wave convolver of high sensitivity and low insersion loss can be provided.

The piezoelectric plate have a thickness with polishing or etching according to frequencies to be excited. By using the above-mentioned heat treatment, the bonding strength of the piezoelectric plate with the semiconductor plate becomes sufficient strong for mechanical polishing. Then, by combining mechanical polishing, chemical etching and the like, the thickness can be changed at a desired value between 1 and 50 μm according to frequencies to be excited. A wavelength of surface acoustic waves is, for example, about 40 μm for 100 MHz of frequency and 4,000 m/sec of acoustic velocity. It is desirable that the thickness of the piezoelectric plate is less than one wavelength if interdigital transducers 3, 3' are provided on a surface of the piezoelectric plate 2, as shown in FIG. 3. This condition is satisfied well by the using the polishing and the like.

Because direct bonding is used, the piezoelectric plate 1 of a single crystal of a desired crystal orientation can be used, while the semiconductor plate 1 may also be a single crystal having a desired carrier concentration which is an important factor on the sensitivity for signals. Therefore, a surface acoustic wave convolver can be made of a combination of single crystals which cannot be realized previously. Because single crystals can be used for the piezoelectric plate and the semiconductor plate, characteristics such as electromechanical coupling factor and a capacitance of the depletion layer thereof becomes much better than those of prior art.

Further, because the interface has a very narrow thickness of 20 nm or less, characteristics of the layered structure can be reproduced well. Because the surface treatment at the direct bonding does not damage the surface, the interface characteristics can also be reproduced well. Then, surface acoustic wave convolvers can be reproduced well. The good reproductivity with direct bonding is advantageous for manufacturing convolvers.

Figure 5:
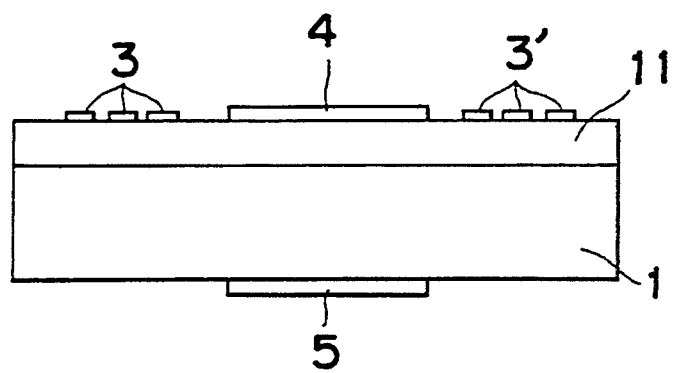
FIG. 5 is a schematic sectional view of another modified example of the basic structure of a surface acoustic wave convolver.

In a modified example of a surface acoustic wave convolver shown in FIG. 5, a piezoelectric plate 11 is made of a single crystal of lithium tantalate of crystal orientation of 36° Y-cut, X propagation. The other components of the convolver is the same as the counterparts shown in FIG. 3.

Because lithium tantalate also has 5% of a relatively high electromechanical coupling factor, a surface acoustic wave convolver of good characteristics with a small insersion loss at the interface can be provided.

Manufacturing processes of the modified example are similar to the manufacturing processes of the convolver shown in FIG. 3. By using the above-mentioned hydrophilic treatment, direct contact and heat treatment, good direct bonding can be obtained. In this case, the direct bonding is ascribed covalent bonds or ionic bonds between oxygen atoms and component atoms or silicon, lithium and tantalum atoms of the plates 1, 11.

This combination of the piezoelectric material and the semiconductor material provides similar good characteristics as a surface acoustic wave convolver, and the productivity and the reliability thereof are good.

Figure 6:
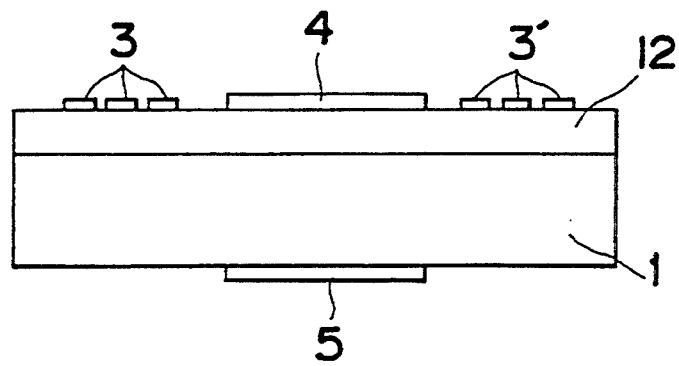
FIG. 6 is a schematic sectional view of a different modified example of the basic structure of a surface acoustic wave convolver.
Figure 7:
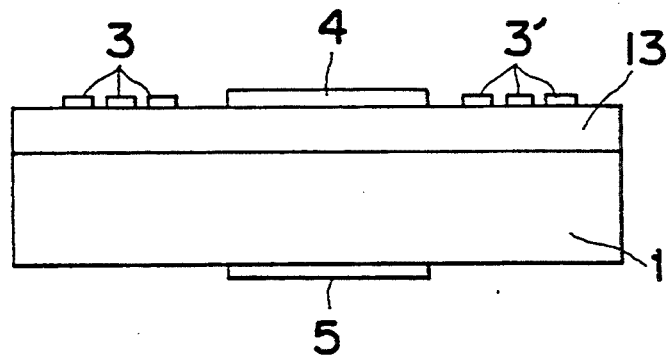
FIG. 7 is a schematic sectional view of a further example of the basic structure of a surface acoustic wave convolver.

In a different modified example of a surface acoustic wave convolver shown in FIG. 6, a piezoelectric plate 12 is made of a single crystal of quartz of crystal orientation of 42° Y-cut, X propagation. The other components of the convolver is the same as the counterparts shown in FIG. 3.

Though quartz has a low electromechanical coupling factor, the stability against temperature change is very excellent. Therefore, a surface acoustic wave convolver stable against temperature can be provided.

Manufacturing processes of this example are similar to the manufacturing processes of the convolver shown in FIG. 3. By using the above-mentioned hydrophilic treatment, direct contact and heat treatment, good direct bonding can be obtained. In this case, the direct bonding is ascribed to covalent bonds or ionic bonds between oxygen atoms and component atoms of the plates 1, 12.

This combination of the piezoelectric material and the semiconductor material provides similar good characteristics as a surface acoustic wave convolver, and the productivity and the reliability thereof are good.

In a still modified example of a surface acoustic wave convolver shown in FIG. 6, a piezoelectric plate 13 is made of a single crystal of lithium borate of crystal orientation of 45° X-cut, Z propagation. The other components of the convolver is the same as the counterparts shown in FIG. 3.

Lithium borate has 1% of electromechanical coupling factor larger than quartz and very stable against temperature change. Therefore, a surface acoustic wave convolver of good temperature characteristic with a small insersion loss at the interface than quartz can be provided.

Manufacturing processes of the modified example is similar to the manufacturing processes of the convolver shown in FIG. 3 except that a weak acid is used as an etchant for lithium borate instead of fluoric acid. By using the abovementioned hydrophilic treatment, direct contact and heat treatment, good direct bonding can be obtained. In this case, the direct bonding is ascribed covalent bonds or ionic bonds between oxygen atoms and component atoms or silicon, lithium and boron atoms of the plates 1, 13.

This combination of the piezoelectric material and the semiconductor material provides similar good characteristics as a surface acoustic wave convolver, and the productivity and the reliability thereof are good.

Embodiment 2

Figure 8:
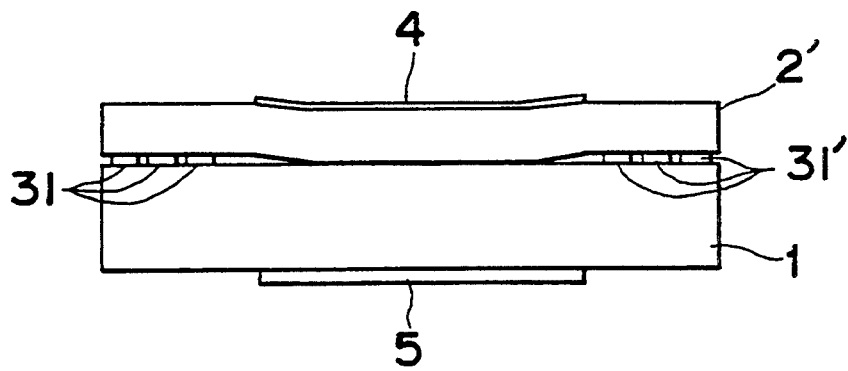
FIG. 8 is a sectional view of a surface acoustic wave convolver of a second embodiment.

Various different structures of the basic structure are explained below. First, FIG. 8 shows a surface acoustic wave convolver of a second embodiment. A semiconductor plate 1 made of silicon or the like is bonded directly with a piezoelectric plate 2' made of, for example, a single crystal of 41° Y-cut, X propagation of lithium niobate by hydrogen bonds due to hydroxyl groups or by covalent or ionic bonds between oxygen atoms and component atoms of the two plates 1, 2'. Interdigital transducers (IDT) 31, 31' as input electrodes for exciting surface acoustic waves are provided separately on the interface between the two plates 1, 2'. An output electrode 4 is provided on the piezoelectric plate 2', while an output electrode 4 is provided on the semiconductor plate at a rear position opposed to the ground electrode 5. The thicknesses of the interdigital transducers 31, 31' are set to be sufficiently thin than the width of the interface (for example, 0.1-1 mm of thickness of the transducers 31, 31' against 10 mm of width of the interface), a sufficient bonding strength can be obtained. Though a gap of about the thickness of the interdigital transducers 31, 31' occurs near the transducers 31, 31', the direct bonding at an interaction section between the interdigital transducers 31, 31' is sufficiently strong. Though FIG. 8 shows a large modification near the transducers 31, 31', this is ascribed to a drawing which enlarges a length along a vertical direction relative to a horizontal direction. Actually, the thickness of the transducers 31, 31' is about 0.1 μm and the width thereof is about 10 μm, while the length of the interaction or bonding section is about 1-4 cm. Therefore, the modification of to piezoelectric plate 2' is actually very small around the transducers 31, 31'.

In the convolver shown in FIG. 8, the interdigital transducers 31, 31' for receiving two input signals are applied directly to the interface. Because the interdigital transducers (IDT) 31, 31' are provided on the piezoelectric plates at the interface between the two plates 1, 2' and surface acoustic waves propagate more along the interface, they interact more effectively with surface charges in the semiconductor plate 1. Therefore, an insersion loss at the interface can be decreased and the convolver has a high efficiency.

A manufacturing method of the convolver of the embodiment is similar to that of the convolver shown in FIG. 3 except a step of forming interdigital transducers 31, 31'. In the manufacturing method, interdigital transducers 31, 31' are formed on the piezoelectric plate 2' or on the semiconductor plate 1 before hydrophilic treatment of the plates 1, 2'. Then, surfaces to be bonded directly of the two plates are made hydrophilic and they are contacted directly as shown in FIG. 8. The interdigital transducers 31, 31' are for example made of Cr—Cu alloy which is not affected much by the hydrophilic treatment and heat treatment.

Embodiment 3

Figure 9:
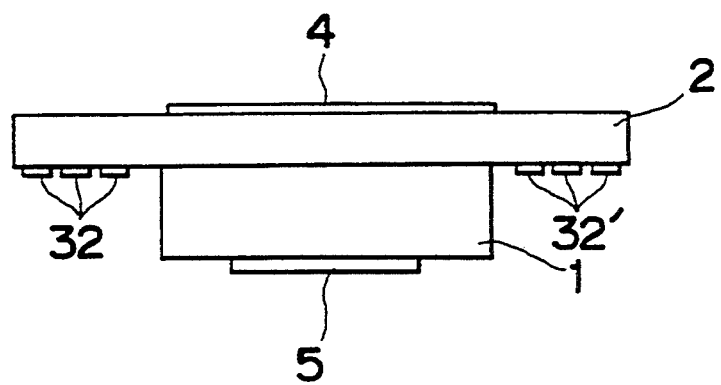
FIG. 9 is a sectional view of a surface acoustic wave convolver of a third embodiment.

FIG. 9 shows a surface acoustic wave convolver of a third embodiment. A semiconductor plate 1 made of silicon or the like is bonded directly with a piezoelectric plate 2 made of, for example, a single crystal of 41° Y-cut, X propagation of lithium niobate and having a larger surface than the semiconductor plate 1. The direct bonding is due to hydrogen bonds between hydroxyl groups or due to covalent or ionic bonds between oxygen atoms and component atoms of the two plates 1, 2. Interdigital transducers (IDT) 32, 32' as input electrodes for exciting surface acoustic waves are formed separately on a free surface of the piezoelectric plate 2 at end portions on which the semiconductor plate 1 is not bonded. An output electrode 4 is provided on the piezoelectric plate 2 on the other surface, while an output electrode 4 is provided on the semiconductor plate at a rear position opposed to the ground electrode 5.

In the convolver shown in FIG. 9, the interdigital transducers 32, 32' for receiving two input signals are applied directly to the interface similarly to those shown in FIG. 8. Because surface acoustic waves propagate more along the interface, they interact more effectively with the surface charges in the semiconductor plate 1. Therefore, an insersion loss at the interface can be decreased and the convolver has a high efficiency.

A manufacturing method of the convolver of the embodiment is similar to that of the convolver shown in FIG. 3 except a step of forming interdigital transducers 32, 32'. In the manufacturing method, interdigital transducers 32, 32' may be formed after the direct bonding of the plates 1, 2. Because the interdigital transducers 32, 32' are formed on the free surface, the thicknesses thereof may be determined without considering the direct bonding.

Embodiment 4

Figure 10:
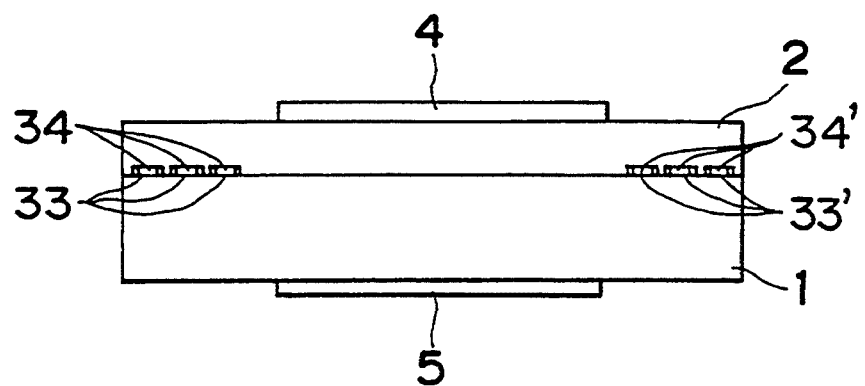
FIG. 10 is a schematic sectional view of a surface acoustic wave convolver of an example of the fourth embodiment.

FIG. 10 shows a surface acoustic wave convolver of a fourth embodiment. A semiconductor plate 1 made of silicon or the like is bonded directly with a piezoelectric plate 2 made of, for example, a single crystal of 41° Y-cut, X propagation of lithium niobate by hydrogen bonds between hydroxyl groups or by covalent or ionic bonds between oxygen atoms and component atoms of the two plates 1, 2. Recesses 34, 34' are formed separately on the interface of the piezoelectric plate 2, and interdigital transducers (IDT) 33, 33' for exciting surface acoustic waves are provided in the recesses 34, 34'. An output electrode 4 is provided on the piezoelectric plate 2', while an output electrode 4 is provided on the semiconductor plate at a rear position opposed to the ground electrode 5.

In the convolver shown in FIG. 10, the interdigital transducers 32, 32' for receiving two input signals are applied directly to the interface similarly to those shown in FIG. 8. Because surface acoustic waves propagate more along the interface, they interact more effectively with the surface charges in the semiconductor plate 1. Therefore, a loss at the interface can be decreased and the convolver has a high efficiency.

A manufacturing method of the convolver of the embodiment is similar to that of the convolver shown in FIG. 3 except a step of forming the recesses 34, 34' before forming the interdigital transducers 33, 33'. Because the interdigital transducers 32, 32' are formed in the recesses 34, 34', the thicknesses thereof may be determined without considering the direct bonding.

Figure 11:
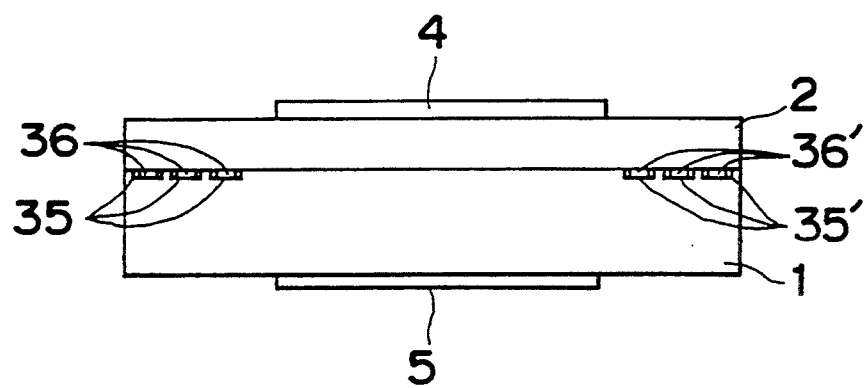
FIG. 11 is a schematic sectional view of a surface acoustic wave convolver of a modified example of the fourth embodiment.

FIG. 11 shows a surface acoustic wave convolver of a modified example of the fourth embodiment. This example is similar to that shown in FIG. 10 except that recesses 35, 35' are formed separately on the interface of the semiconductor plate 1, and interdigital transducers (IDT) 36, 36' as input electrodes for exciting surface acoustic waves are provided in the recesses 35, 35'.

Because the interdigital transducers 36, 36' are formed on the semiconductor plate 1 at the interface of the semiconductor plate 1 with the piezoelectric plate 1, surface acoustic waves are excited efficiently. It is advantageous that the semiconductor plate 1 is more favorable for etching for forming the recesses than the piezoelectric plate. Further, it is also advantageous that the temperature dependence of characteristics can be improved by decreasing thermal expansion of the distance between the interdigital transducers.

Embodiment 5

Figure 12:
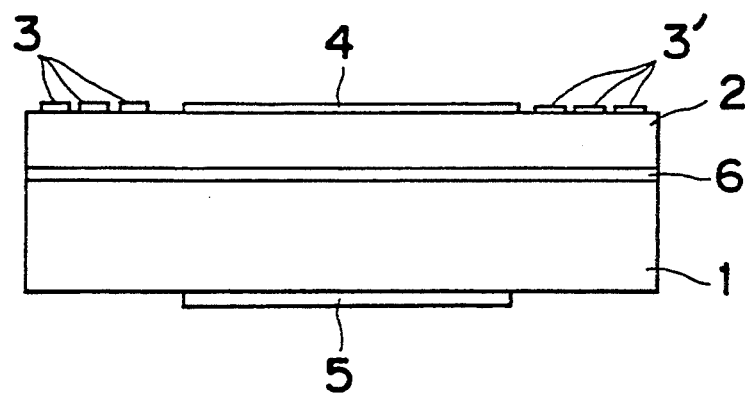
FIG. 12 is a schematic sectional view of a second basic structure of a surface acoustic wave-semiconductor composite device of the invention.

FIG. 12 shows a second basic structure of a surface acoustic wave-semiconductor composite device. The device shown in FIG. 12 is a surface acoustic wave convolver. A semiconductor plate 1 made of silicon or the like is bonded with a piezoelectric plate 2 made of, for example, lithium niobate, lithium tantalate, quartz, lithium borate or the like with an inorganic thin film 6 interposed between the two plates 1 and 2. Interdigital transducers (IDT) 3, 3' as input electrodes for exciting surface acoustic waves are provided separately on the piezoelectric plate 2. An output electrode 4 is provided between the interdigital transducers 3, 3' on the piezoelectric plate 2, while an output electrode 4 is provided on the semiconductor plate at a rear position opposed to the ground electrode 5. This structure is different from that shown in FIG. 3 only on the inorganic thin film 6.

The inorganic thin film 6 is made of, for example, silicon or a silicide such as silicon oxide or silicon nitride, and it can be prepared easily with vacuum deposition, sputtering, chemical vapor deposition, sol-gel method or the like.

In the above-mentioned structure, if the inorganic thin film 6 is an insulator layer, a surface acoustic wave convolver of a so-called metal-insulator-semiconductor (MIS) structure is provided. In the MIS structure, characteristics of the depletion layer at the surface of the semiconductor plate 1 become stable, and a convolver of good characteristics can be provided.

If the thickness of the inorganic thin film 6 is sufficiently thin than a wavelength of surface acoustic waves to be used, convolver characteristics similar to those of the convolver shown in FIG. 3 can be realized. Then, the thickness of the inorganic thin film 6 is preferably smaller than a wavelength of surface acoustic waves to be used. A wavelength of surface acoustic waves is about 40 μm for 100 MHz of frequency and 4,000 m/sec of acoustic velocity. Usually, a thickness of an inorganic thin film deposited by the above-mentioned deposition technique is about 0.1–5 μm, and it is possible to form the inorganic thin film having a thickness sufficiently thinner than the wavelength.

The inorganic thin film 6 can be bonded directly similarly to the structure shown in FIG. 3, as explained below. First, a thin film of silicon or a silicide such as silicon oxide or silicon nitride is deposited on a surface of the piezoelectric plate 2 and/or on a surface of the semiconductor plate 1 with vacuum deposition, sputtering, chemical vapor deposition, sol-gel method or the like. Next, areas of surfaces to be bonded directly are subjected to the hydrophilic treatment, contact and heat treatment as explained above on the first basic structure, and the mechanism of the direct bonding is similar to the first basic structure. The direct bonding is ascribed to hydrogen bonds due to hydroxyl groups or by covalent or ionic bonds due to oxygen atoms and component atoms, lithium, niobium, tantalum or boron of the two plates 1, 2. When the inorganic thin film 6 is made of silicon nitride, nitrogen atoms also contribute to the direct bonding, and if the inorganic thin film 6 is made of other component atoms, they may contribute to the direct bonding.

The insertion of the inorganic thin film 6 between the two plates 1 and 2 has several advantages on manufacturing processes. First, a yield of the convolver increases because even if dusts and the like happen to exist on the interface, they can be included in the inorganic thin film 6. Second, materials of the semiconductor plate 1 can be selected in a wider range when the inorganic thin film 6 is formed on the semiconductor plate 1. For example, if an epitaxial film of low concentration is formed on the surface of the semiconductor plate and a film of silicon oxide or silicon nitride is formed thereon, the latter film plays a role of a passivation film and the characteristics of the epitaxial film can be prevented from deterioration. Further, the semiconductor plate may be made of a compound semiconductor such as GaAs or InP which is hard to form covalent bonds with a piezoelectric plate. When the inorganic thin film 6 is formed on the piezoelectric plate 2, materials of the plate 2 can also be selected in a wider range similarly.

Embodiment 6

Figure 13:
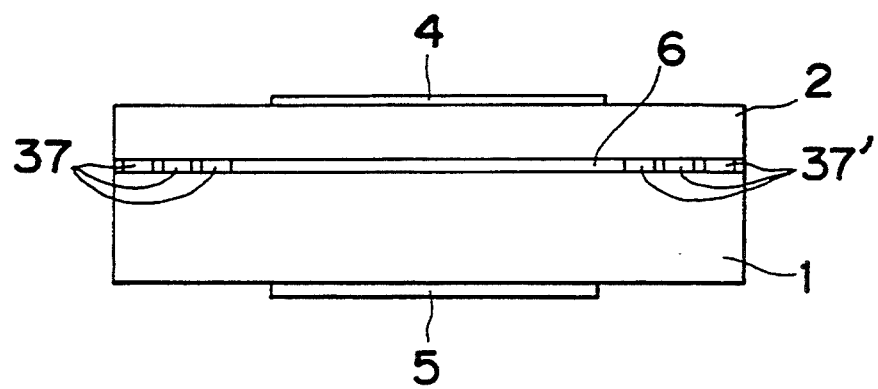
FIG. 13 is a schematic sectional view of a modified example of the second basic structure of a surface acoustic wave-semiconductor composite device.

FIG. 13 shows another embodiment of a surface acoustic wave convolver of the second basic type. This structure is different from that shown in FIG. 12 only on the interdigital transducers 37, 37' as input electrodes provided in the inorganic thin film 6. Because surface acoustic waves propagate more along the interface, they interact more effectively with the surface charges in the semiconductor plate 1. Therefore, a loss at the interface can be decreased and the convolver has a high efficiency.

A manufacturing method of the convolver of this embodiment is similar to that of the convolver shown in FIG. 12 except a step of forming interdigital transducers 37, 37'. In the manufacturing method, interdigital transducers 37, 37' are formed on the piezoelectric plate 2 or on the semiconductor plate 1 before forming the inorganic thin film 6. Then, manufacturing steps similar to those of the structure shown in FIG. 12 are performed.

This structure has an advantage that a metal such as aluminum which is liable to be deteriorated by the hydrophilic treatment can be used. Further, because the inorganic thin film 6 is formed on the interdigital transducers 37, 37', the surface of the inorganic thin film can be planarized, and a yield of the convolver is increased. As to the planarization, if the inorganic thin film 6 is formed thicker than the transducers 37, 37', the inorganic thin film 6 may be planarized by polishing, and such a planarized surface is very advantageous. The interdigital transducers 37, 37' may be provided on the piezoelectric plate 2 or on the semiconductor plate 1. It is also possible to adjust the thicknesses of the transducers 37, 37' and the inorganic thin film 6.

Embodiment 7

Figure 14:
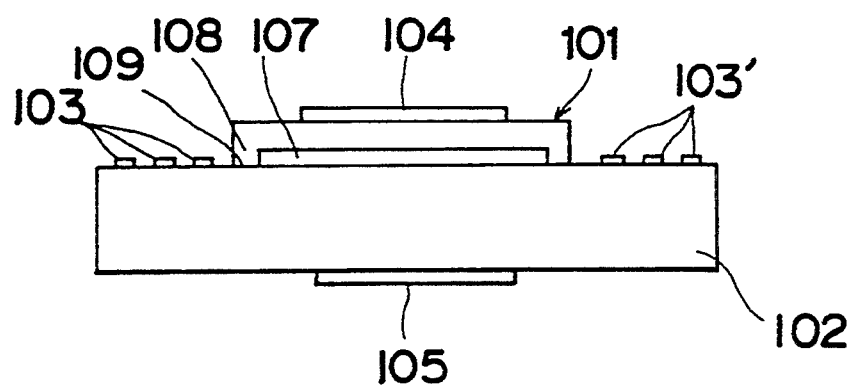
FIG. 14 is a schematic sectional view of a third basic structure of a surface acoustic wave-semiconductor composite device.

FIG. 14 shows a third basic structure of a surface acoustic wave-semiconductor composite device. The device shown in FIG. 14 is a separate medium structure surface acoustic wave convolver. A piezoelectric plate 102 made of, for example, lithium niobate, lithium tantalate, quartz, lithium borate or the like made of silicon or the like is bonded with a semiconductor plate 101 having a low carrier concentration region at a surface and a high carrier concentration region inside the plate 101. The semiconductor plate 101 has thick portions 108 provided at its peripherals, and the thick portions 108 are bonded directly with the piezoelectric plate 102 at the interface 109 and play a role as spacers. This bonding forms a narrow gap 107 between the semiconductor plate 101 and the piezoelectric plate 102 except the thick portions 108. The gap has a constant distance, say 50 nm, between the semiconductor plate 101 and the piezoelectric plate 102. The direct bonding is ascribed to hydrogen bonds due to hydroxyl groups or to covalent or ionic bonds due to oxygen atoms and component atoms of the two plates 101, 102. Interdigital transducers (IDT) 103, 103' as input electrodes for exciting surface acoustic waves are provided separately on a free surface of the piezoelectric plate 102 outside the thick portions 108. An output electrode 104 is provided on the semiconductor plate 101, while a ground electrode 105 is provided on the piezoelectric plate 102 at a rear position opposed to the output electrode 104.

In the separate medium structure surface acoustic wave convolver, two input signals are applied to the interdigital transducers 103, 103' respectively, and surface acoustic waves are excited to propagate along directions opposite to each other. The excited acoustic waves change the potential at the semiconductor plate 101 opposing the piezoelectric plate 102 via the gap 107, and this changes a capacitance of a depletion layer at the interface. Because of nonlinearity of this change, convolution signals of the input signals can be taken out between the output electrode 4 and the ground electrode 5.

Figure 2:
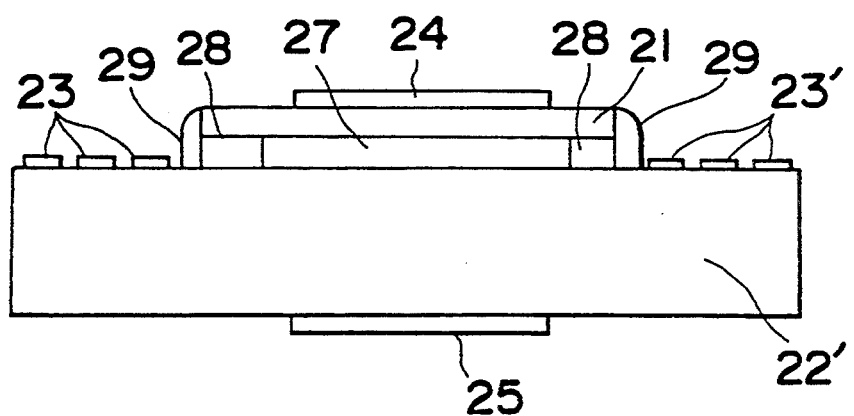
FIG. 2 is a schematic sectional view of a representative structure of a separation medium structure surface acoustic wave convolver.

This embodiment differs from prior art convolver shown in FIG. 2 on a microscopic structure of the fixing between the two plates. Priorly, the plates are fixed with an inorganic adhesive agent or mechanically from above and below. In the embodiment, the plates are fixed by direct bonding. Then, the gap 107 can be controlled precisely, and thermal and mechanical reliabilities can be improved largely.

Next, a manufacturing method of the surface acoustic wave-semiconductor composite device is explained. First, a piezoelectric plate 102 of, for example, a single crystal of lithium niobate of a specific crystal orientation is prepared to have a specular surface. On the other hand, a semiconductor plate 101, for example, having a low carrier concentration region at a surface and a high carrier concentration region inside is provided to have a specular surface. The two surfaces are cleaned sufficiently, and an unnecessary layer at the surfaces are removed if necessary by etching by using an etchant of fluoric acid or the like.

Then, a part of the semiconductor plate 101 is further removed with an etchant to form the thick portions 108 or a recess. The depth or the recess is equal to a value required for the gap 107.

Next, the two surfaces of the two plates 101, 102 are subjected to hydrophilic treatment as explained above. The processes thereafter are similar to those explained above. The mechanism of the direct bonding and the structure at the interface between the two plates 101 and 102 are similar to those of the first basic structure.

The interface between the two plates 101, 102 is bonded directly in an atomic order, without using a conventional adhesive agent, and it has a thickness of 20 nm or less. Therefore, even if the depth of the recess is shallow, the gap 107 can be formed precisely. The etching of the silicon plate 101 can be performed at a high precision. For example, if a silicon plate of (111) plane is etched, the etching rate along the direction is very slow than those of other directions, a uniform recess can be formed to a desired depth very precisely. It is possible to form a recess of a rectangular shape of 20 * 5 mm$^2$ with a uniform depth of 50 nm can be formed.

A most important problem of a separate medium structure convolver is the control of the gap and the thermal and mechanical stabilities thereof. The convolver of the embodiment makes it possible to control the gap in an atomic scale and to keep it in a state stable thermally and mechanically. Then, a surface acoustic wave convolver of high sensitivity and low insersion loss can be provided.

Figure 15:
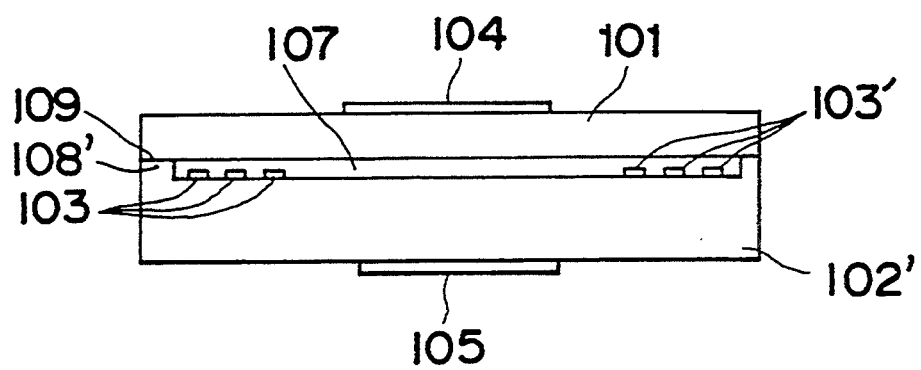
FIG. 15 is a schematic sectional view of a modified example of the third basic structure of a surface acoustic wave-semiconductor composite device.

In the embodiment, the recess is formed on a surface of the semiconductor plate 101. However, it may also be formed similarly on a surface of the piezoelectric plate. FIG. 15 shows a modified example of the separate medium structure convolver wherein the recess is formed on a surface of the piezoelectric plate 102'. Another different point of this structure is that the interdigital transducers 103 and 103' are formed on the recess. In this structure, characteristics of the convolver of this example are similar to those of the convolver shown in FIG. 14.

Embodiment 8

Figure 16:
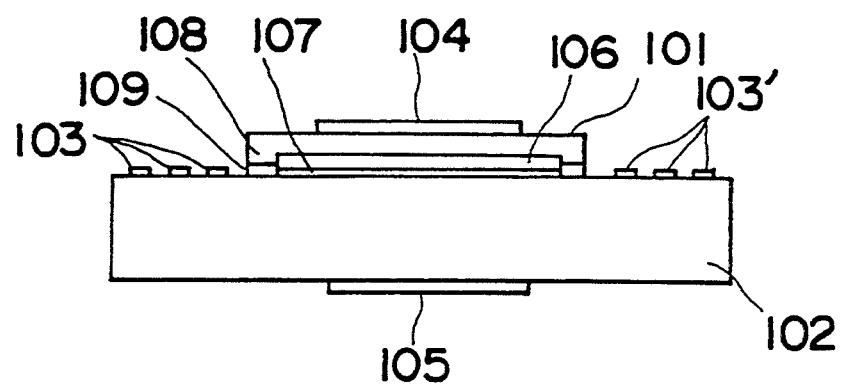
FIG. 16 shows a fourth basic structure of a surface acoustic wave-semiconductor composite device.

FIG. 16 shows a fourth basic structure of a surface acoustic wave-semiconductor composite device. The device shown in FIG. 16 is a separate medium structure surface acoustic wave convolver. A piezoelectric plate 102 made of, for example, lithium niobate, lithium tantalate, quartz, lithium borate or the like is bonded with a semiconductor plate 101. The semiconductor plate 101 has thick portions 108 provided at its peripherals to form a recess. An inorganic thin film 106 is formed on the recess of the semiconductor plate 101. The thick portions 108 are bonded directly with the piezoelectric plate 102 at the interface 109 and play a role as spacers, and this bonding forms a gap 107 between the inorganic thin film 106 and the piezoelectric plate 102 except the thick portions 108. The direct bonding is due to hydrogen bonds between hydroxyl groups or to covalent or ionic bonds due to oxygen atoms and component atoms of the two plates 101, 102. An inorganic thin film 106 is provided on the piezoelectric plate 102 inside the gap 107. Interdigital transducers (IDT) 103, 103' as input electrodes for exciting surface acoustic waves are provided separately on a free surface of the piezoelectric plate 102 outside the thick portions 108. An output electrode 104 is provided on the semiconductor plate 101, while a ground electrode 105 is provided on the piezoelectric plate 102 at a rear position opposed to the output electrode 104.

This structure is different from the structure shown in FIG. 14 on a point that the inorganic thin film 106 is formed on the semiconductor plate 101. The film 106 is made of, for example, silicon or a silicide such as silicon oxide or silicon nitride, and it can be formed with vacuum deposition, sputtering, chemical vapor deposition, sol-gel method or the like.

Usually, a thickness of an inorganic thin film 106 deposited by the above-mentioned deposition technique is about 0.1–5 μm, and it is possible to adjust the distance of the gap to the depth of the recess by making the thickness of the inorganic thin film 106 uniform. Therefore, the distance of the gap can be controlled at a high precision.

In the embodiment, the inorganic thin film 106 is formed on the semiconductor plate 101. However, it may be formed on the piezoelectric plate 102 alternately.

In the above-mentioned structure, if the inorganic thin film 106 is an insulator layer, a surface acoustic wave convolver of a so-called metal-insulator-semiconductor (MIS) structure is provided. In the MIS structure, characteristics of the depletion layer at the surface of the semiconductor plate 101 become stable, and a convolver of good characteristics can be provided.

The insertion of the inorganic thin film 106 between the two plates 101 and 102 has several advantages on manufacturing processes, as in the second basic structure. Yield of the convolver increases, and materials of the semiconductor plate and the piezoelectric plate can be selected in a wider range. For example, the semiconductor plate may be made of a compound semiconductor such as GaAs or InP which is hard to form covalent bonds.

Next, a manufacturing method of the surface acoustic wave-semiconductor composite device is explained. A recess is formed on one of plates 101, 102 similarly to the method of the structure shown in FIG. 14. Then, an inorganic thin film 106 of, for example, silicon or a silicide such as silicon oxide or silicon nitride is formed over the whole surface in correspondence to the recess with vacuum deposition, sputtering, chemical vapor deposition, sol-gel method or the like. Next, a surface to be adhered is subjected to the hydrophilic treatment, contact and heat treatment. Thus, a surface of the inorganic thin film 106 is bonded directly to the piezoelectric plate 102 or to the semiconductor plate 101. The mechanism of the direct bonding and the structure at the interface between the two plates 101 and 102 are similar to those of the first basic structure. The direct bonding is ascribed to hydrogen bonds due to hydroxyl groups or by covalent or ionic bonds due to oxygen atoms and component atoms, lithium, niobium, tantalum or boron of the two plates 101, 102. When the inorganic thin film 106 is made of silicon nitride, nitrogen atoms also contribute to the direct bonding, and if the inorganic thin film 106 is made of other component atoms, they may contribute to the direct bonding.

Embodiment 9

Figure 17:
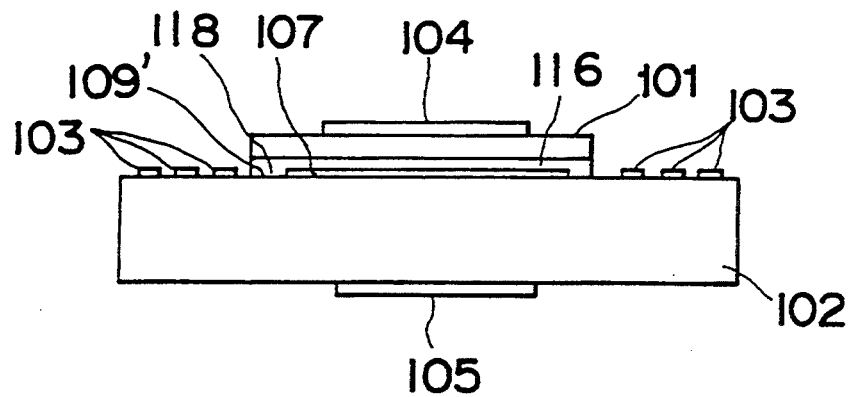
FIG. 17 is a schematic sectional view of a modified example of the fourth basic structure of a surface acoustic wave-semiconductor composite device.

FIG. 17 shows a second example of the fourth basic structure of a surface acoustic wave-semiconductor composite device. The device shown in FIG. 17 is a separate medium structure surface acoustic wave convolver. A piezoelectric plate 102 made of, for example, lithium niobate, lithium tantalate, quartz, lithium borate or the like is provided. On the other hand, an inorganic thin film 116 is formed on a semiconductor plate 101. The inorganic thin film 116 has thick portions 118 formed at its peripherals. The thick portions 118 can be formed easily and precisely with photolithography and etching, and the thick portions 108' are bonded directly with the piezoelectric plate 102 at the interface 109' and play a role as spacers. This bonding forms a gap 107 between the inorganic thin film 116 and the piezoelectric plate 102 except the thick portions 118. The direct bonding is ascribed to hydrogen bonds due to hydroxyl groups or to covalent or ionic bonds due to oxygen atoms and component atoms of the inorganic thin film 116 and the piezoelectric plate 102. Interdigital transducers (IDT) 103, 103' as input electrodes for exciting surface acoustic waves are provided separately on a free surface of the piezoelectric plate 102 outside the thick portions 118. An output electrode 104 is provided on the semiconductor plate 101, while a ground electrode 105 is provided on the piezoelectric plate 102 at a rear position opposed to the output electrode 104.

In the embodiment, the inorganic thin film 116 is remained in the gap, but the inorganic thin film 116 may be removed completely except the thick portions 118. The inorganic thin film 116 is formed on the semiconductor plate 101. However, it may be formed on the piezoelectric plate 102.

In the above-mentioned embodiments, surface acoustic waves convolvers are explained mainly. However, other devices such as a surface state memory in surface acoustoelectric correlator are produced by using similar structures of the above-mentioned convolvers, as described by A. Bers and J. H. Cafarella (Applied Physics Letters, Col. 25, 133–135 (1974)). That is, the above-mentioned structures of the various convolvers can also be used as other devices different from the surface acoustic wave convolver.

Further, the above-mentioned various layered structures of a piezoelectric plate and a semiconductor plate bonded directly with each other can be used not only to the surface acoustic wave convolver, but also to other devices with different arrangements of electrodes such as a surface acoustic wave amplifies described in a paper by K. Yamanouchi and K. Shibayama (J. Applied Physics, Vol. 43, 856–862. (1972)). The surface acoustic wave amplifier amplifies surface acoustic wave by making them interact with charges (electrons or holes) at a surface of the semiconductor. In a representative structure, a piezoelectric plate is layered with a semiconductor plate or is opposed to a semiconductor plate with a very small gap. Then, surface acoustic waves are propagated at an interface of the piezoelectric plate at a side of the semiconductor plate, while charges are drifted on the surface of the semiconductor plate along the same direction as the surface acoustic waves, so that an electromagnetic field generated by the surface acoustic waves is coupled with the drift charges so as to make the drift charges move faster than the propagation speed of the surface acoustic waves. Then, an energy is transferred from the drift charges to the surface acoustic waves so as to enhance the surface acoustic waves. For example, in representative structures shown in FIGS. 3 and 14, an input electrode and an output electrode are provided on the semiconductor plate in parallel to the interface between the piezoelectric plate and the semiconductor plate along a propagation direction of the surface acoustic waves, instead of the input and output electrodes 4, 5; 104, 105 opposed to each other with respect to the interface. Then, surface acoustic waves are propagated from one of a pair of the interdigital electrodes 3, 3'; 103, 103', while a pulse voltage is applied between the input and output electrodes simultaneously. Then, surface acoustic waves can be taken out from the other of the interdigital electrodes. Therefore, the surface acoustic wave amplifier has a similar structure essentially to the structures of the above-mentioned surface acoustic wave convolver, except the positions of the input and output electrodes. Thus, the structures realized by direct bonding can also be applied to the surface acoustic wave amplifier, and similar advantages due to direct bonding can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A surface acoustic wave-semiconductor composite device comprising:
    a piezoelectric plate;
    a semiconductor plate bonded directly to the piezoelectric plate by hydrogen bonds between hydroxyl groups;
    input electrodes provided to apply a plurality of input signals to the piezoelectric plate, whereby surface acoustic waves are excited in the piezoelectric plate by applying the input signals; and
    an output electrode provided to detect a convolution output signal of a change in electric potential of the semiconductor plate at an interface of the semiconductor plate with the piezoelectric plate.

2. The device according to claim 1, wherein a thickness of a direct bonding layer due to the hydrogen bonds at the interface between said piezoelectric plate and said semiconductor plate is 20 nm or less.

3. The device according to claim 1, wherein said input electrodes are formed on said piezoelectric plate at the interface of said piezoelectric plate with said semiconductor plate.

4. The device according to claim 1, wherein said input electrodes are formed on said semiconductor plate at the interface of said piezoelectric plate with said semiconductor plate.

5. The device according to claim 1, wherein said piezoelectric plate is made of a single crystal of lithium niobate, lithium tantalate, lithium borate or quartz.

6. A surface acoustic wave-semiconductor composite device comprising:
    a piezoelectric plate;
    a semiconductor plate bonded directly to the piezoelectric plate by covalent or ionic bonds between oxygen atoms and component atoms of the piezoelectric plate and the semiconductor plate;
    input electrodes provided to apply a plurality of input signals to the piezoelectric plate, whereby surface acoustic waves are excited in the piezoelectric plate by applying the input signals; and
    an output electrode provided to detect a convolution output signal of a change in electric potential of the semiconductor plate at an interface of the semiconductor plate with the piezoelectric plate.

7. The device according to claim 6, wherein a thickness of a direct bonding layer due to the covalent or ionic bonds at the interface between said piezoelectric plate and said semiconductor plate is 20 nm or less.

8. The device according to claim 6, wherein said input electrodes are formed on said piezoelectric plate at the interface of said piezoelectric plate with said semiconductor plate.

9. The device according to claim 6, wherein said input electrodes are formed on said semiconductor plate at the interface of said piezoelectric plate with said semiconductor plate.

10. The device according to claim 5, wherein said piezoelectric plate is made of a single crystal of lithium niobate, lithium tantalate, lithium borate or quartz.

11. A surface acoustic wave-semiconductor composite device comprising:
    a piezoelectric plate;
    a semiconductor plate;
    an inorganic film applied to one of the piezoelectric plate and the semiconductor plate and bonded directly by hydrogen bonds between hydroxyl groups to the other of the piezoelectric plate and the semiconductor plate;
    input electrodes provided to apply a plurality of input signals to the piezoelectric plate, whereby surface acoustic waves are excited in the piezoelectric plate by applying the input signals; and
    an output electrode provided to detect a convolution output signal of a change in electric potential of the semiconductor plate at an interface of the semiconductor plate with the piezoelectric plate.

12. The device according to claim 11, wherein a thickness of a direct bonding layer due to the hydrogen bonds at the interface between said piezoelectric plate and said semiconductor plate is 20 nm or less.

13. The device according to claim 11, wherein said input electrodes are embedded in said inorganic film.

14. The device according to claim 11, wherein said piezoelectric plate is made of a single crystal of lithium niobate, lithium tantalate, lithium borate or quartz.

15. A surface acoustic wave-semiconductor composite device comprising:
    a piezoelectric plate;
    a semiconductor plate;
    an inorganic film applied to one of the piezoelectric plate and the semiconductor plate and bonded directly to the other of the piezoelectric plate and the semiconductor plate by covalent or ionic bonds between oxygen atoms and component atoms of the piezoelectric plate, the inorganic film and the semiconductor plate;

input electrodes provided to apply a plurality of input signals to the piezoelectric plate, whereby surface acoustic waves are excited in the piezoelectric plate by applying the input signals; and an output electrode provided to detect a convolution output signal of a change in electric potential of the semiconductor plate at an interface of the semiconductor plate with the piezoelectric plate.

16. The device according to claim 15, wherein a thickness of a direct bonding layer due to the covalent or ionic bonds at the interface between said piezoelectric plate and said semiconductor plate is 20 nm or less.

17. The device according to claim 15, wherein said input electrodes are embedded in said inorganic film.

18. The device according to claim 15, wherein said piezoelectric plate is made of a single crystal of lithium niobate, lithium tantalate, lithium borate or quartz.

19. The device according to claim 15, wherein said inorganic film is made of silicon or a silicide.

20. A surface acoustic wave-semiconductor composite device comprising:
a piezoelectric plate;
a semiconductor plate bonded directly to the piezoelectric plate by hydrogen bonds of hydroxyl groups, which semiconductor plate having a gap except portions bonded directly to the piezoelectric plate, which gap having a constant distance relative to the piezoelectric plate;
input electrodes provided to apply a plurality of input signals to the piezoelectric plate, whereby surface acoustic waves are excited in the piezoelectric plate by applying the input signals; and
an output electrode provided to detect a convolution output signal of a change in electric potential of the semiconductor plate at an interface of the semiconductor plate with the piezoelectric plate.

21. The device according to claim 20, wherein a thickness of a direct bonding layer due to the hydrogen bonds at the interface between said piezoelectric plate and said semiconductor plate is 20 nm or less.

22. The device according to claim 20, wherein said piezoelectric plate is made of a single crystal of lithium niobate, lithium tantalate, lithium borate or quartz.

23. A surface acoustic wave-semiconductor composite device comprising:
a piezoelectric plate;
a semiconductor plate bonded directly to the piezoelectric plate by covalent or ionic bonds between oxygen atoms and component atoms of the piezoelectric plate and the semiconductor plate, which semiconductor plate having a gap except portions bonded directly to the piezoelectric plate, which gap having a constant distance relative to the piezoelectric plate;
input electrodes provided to apply a plurality of input signals to the piezoelectric plate, whereby surface acoustic waves are excited in the piezoelectric plate by applying the input signals; and
an output electrode provided to detect a convolution output signal of a change in electric potential of the semiconductor plate at an interface of the semiconductor plate with the piezoelectric plate.

24. The device according to claim 23, wherein a thickness of a direct bonding layer due to the covalent or ionic bonds at the interface between said piezoelectric plate and said semiconductor plate is 20 nm or less.

25. The device according to claim 23, wherein said piezoelectric plate is made of a single crystal of lithium niobate, lithium tantalate, lithium borate or quartz.

26. A surface acoustic wave-semiconductor composite device comprising:
a piezoelectric plate;
a semiconductor plate;
an inorganic film applied to one of the piezoelectric plate and the semiconductor plate and bonded directly to the other of the piezoelectric plate and the semiconductor plate by hydrogen bonds of hydroxyl groups, which inorganic film having a gap except portions bonded directly to the piezoelectric plate, which gap having a constant distance relative to the other of the piezoelectric plate and the semiconductor plate;
input electrodes provided to apply a plurality of input signals to the piezoelectric plate, whereby surface acoustic waves are excited in the piezoelectric plate by applying the input signals; and
an output electrode provided to detect a convolution output signal of a change in electric potential of the semiconductor plate at an interface of the semiconductor plate with the piezoelectric plate.

27. The device according to claim 26, wherein a thickness of a direct bonding layer due to the hydrogen bonds at the interface between said piezoelectric plate and said semiconductor plate is 20 nm or less.

28. The device according to claim 26, wherein said piezoelectric plate is made of a single crystal of lithium niobate, lithium tantalate, lithium borate or quartz.

29. The device according to claim 26, wherein inorganic film is made of silicon or a silicide.

30. A surface acoustic wave-semiconductor composite device comprising:
a piezoelectric plate;
a semiconductor plate;
an inorganic film applied to one of the piezoelectric plate and the semiconductor plate and bonded directly to the other of the piezoelectric plate and the semiconductor plate by covalent or ionic bonds between oxygen atoms and component atoms of the piezoelectric plate, the inorganic film and the semiconductor plate, which inorganic film having a gap except portions bonded directly to the piezoelectric plate, which gap having a constant distance relative to the other of the piezoelectric plate and the semiconductor plate;
input electrodes provided to apply a plurality of input signals to the piezoelectric plate, whereby surface acoustic waves are excited in the piezoelectric plate by applying the input signals; and
an output electrode provided to detect a convolution output signal of a change in electric potential of the semiconductor plate at an interface of the semiconductor plate with the piezoelectric plate.

31. The device according to claim 30, wherein a thickness of a direct bonding layer due to the hydrogen bonds at the interface between said piezoelectric plate and said semiconductor plate is 20 nm or less.

32. The device according to claim 30, wherein said piezoelectric plate is made of a single crystal of lithium niobate, lithium tantalate, lithium borate or quartz.

33. The device according to claim 30, wherein inorganic film is made of silicon or a silicide.

34. A surface acoustic wave-semiconductor composite device comprising:
a piezoelectric plate; and a semiconductor plate bonded directly to the piezoelectric plate by hydrogen bonds between hydroxyl groups.

35. A surface acoustic wave-semiconductor composite device comprising:
a piezoelectric plate; and
a semiconductor plate bonded directly to the piezoelectric plate by covalent or ionic bonds between oxygen atoms and component atoms of the piezoelectric plate and the semiconductor plate.

36. A surface acoustic wave-semiconductor composite device comprising:
a piezoelectric plate;
a semiconductor plate; and
an inorganic film applied to one of the piezoelectric plate and the semiconductor plate and bonded directly by hydrogen bonds between hydroxyl groups to the other of the piezoelectric plate and the semiconductor plate.

37. A surface acoustic wave-semiconductor composite device comprising:
a piezoelectric plate;
a semiconductor plate; and
an inorganic film applied to one of the piezoelectric plate and the semiconductor plate and bonded directly to the other of the piezoelectric plate and the semiconductor plate by covalent or ionic bonds between oxygen atoms and component atoms of the piezoelectric plate, the inorganic film and the semiconductor plate.

38. A surface acoustic wave-semiconductor composite device comprising:
a piezoelectric plate; and
a semiconductor plate bonded directly to the piezoelectric plate by hydrogen bonds between hydroxyl groups, which semiconductor plate having a gap except portions bonded directly to the piezoelectric plate, which gap having a constant distance relative to the piezoelectric plate.

39. A surface acoustic wave-semiconductor composite device comprising:
a piezoelectric plate; and
a semiconductor plate bonded directly to the piezoelectric plate by covalent or ionic bonds between oxygen atoms and component atoms of the piezoelectric plate and the semiconductor plate, which semiconductor plate having a gap except portions bonded directly to the piezoelectric plate, which gap having a constant distance relative to the piezoelectric plate.

40. A surface acoustic wave-semiconductor composite device comprising:
a piezoelectric plate;
a semiconductor plate; and
an inorganic film applied to one of the piezoelectric plate and the semiconductor plate and bonded directly to the other of the piezoelectric plate and the semiconductor plate by hydrogen bonds between hydroxyl groups, which inorganic film having a gap except portions bonded directly to the piezoelectric plate, which gap having a constant distance relative to the other of the piezoelectric plate and the semiconductor plate.

41. A surface acoustic wave-semiconductor composite device comprising:
a piezoelectric plate;
a semiconductor plate; and
an inorganic film applied to one of the piezoelectric plate and the semiconductor plate and bonded directly to the other of the piezoelectric plate and the semiconductor plate by covalent or ionic bonds between oxygen atoms and component atoms of the piezoelectric plate, the inorganic film and the semiconductor plate, which inorganic film having a gap except portions bonded directly to the piezoelectric plate, which gap having a constant distance relative to the other of the piezoelectric plate and the semiconductor plate.

* * * * *